United States Patent [19]

Custode

[11] Patent Number: 4,749,662
[45] Date of Patent: Jun. 7, 1988

[54] DIFFUSED FIELD CMOS-BULK PROCESS

[75] Inventor: Frank Z. Custode, Norco, Calif.

[73] Assignee: Rockwell International Corporation, El Segundo, Calif.

[21] Appl. No.: 837,560

[22] Filed: Mar. 3, 1986

Related U.S. Application Data

[63] Continuation-in-part of Ser. No. 681,523, Dec. 14, 1984, abandoned.

[51] Int. Cl.$^4$ .................................................. H01L 21/76
[52] U.S. Cl. ............................................. 437/58; 437/70
[58] Field of Search ............... 29/571, 576 B, 576 W, 29/578; 148/1.5, 187; 437/58, 70

[56] References Cited

U.S. PATENT DOCUMENTS

| | | | |
|---|---|---|---|
| 3,961,999 | 6/1976 | Antipov | 148/175 |
| 3,966,514 | 6/1976 | Feng et al. | 148/187 |
| 4,295,266 | 10/1981 | Hsu | 29/571 |
| 4,345,366 | 8/1982 | Brower | 29/571 |
| 4,431,459 | 2/1984 | Teng | 148/1.5 |
| 4,454,646 | 6/1984 | Joy et al. | 29/576 W |
| 4,462,151 | 7/1984 | Geipel, Jr. et al. | 29/576 B |
| 4,468,855 | 9/1984 | Sasaki | 29/576 B |
| 4,470,852 | 9/1984 | Ellsworth | 148/1.5 |
| 4,472,873 | 9/1984 | Ko | 29/576 B |

OTHER PUBLICATIONS

"VLSI Fabrication Principles", S. K. Ghandhi, 1983, John Wiley & Sons, pp. 386, 328, 557, 580.

Primary Examiner—Brian E. Hearn
Assistant Examiner—T. N. Quach
Attorney, Agent, or Firm—H. Fredrick Hamann; George A. Montanye; Wilfred G. Caldwell

[57] ABSTRACT

The present invention is a CMOS process for forming an N-channel device and a P-channel device on a doped substrate wherein an active region surrounded by field for the N-channel device is delineated to comprise a thin layer of oxide, a layer of nitride and a further layer of oxide. An active region surrounded by field of the P-channel device is delineated to comprise a thin layer of oxide and a layer of nitride. A well beneath the P-channel active region and the surrounding field region therefor is implanted. Then, the N-channel field is implanted. The oxide layer is removed from the N-channel active region and field oxide is grown for both channels while the well implant and the field implant are concurrently driven-in. The nitride layers are removed, and sacrificial oxide is grown and removed. Implanting is carried out for threshold adjust. The gate oxide is grown, and the gate electrodes of doped polysilicon are delineated for each channel. An activated source and drain is established for each channel. The crossover oxide is deposited, and metal contacts are established to each source and drain and to the gate polysilicon through the crossover oxide.

6 Claims, 5 Drawing Sheets 1.25 - 1.50 UM CMOS PROCESS FLOW
ISOLATION TECHNIQUES $t_{ox} = 7500 \text{ Å}$
$L_1 = 0.450 \mu m$
$L_2 = 0.225 \mu m$
$m_1 = 0.75 \quad m_2 = 2.00$
$L_1 > L_2$
$m_1 < m_2$ ⊢ 0.455 μm ⊣

⊢ 0.225 μm ⊣

DIFFUSED FIELD CMOS-BULK PROCESS

"This application is a continuation-in-part of application Serial. No. 681,523, filed 12/14/84 now abandoned."

BACKGROUND OF THE INVENTION

1. Field of the Invention

The subject invention relates to the manufacture of CMOS transistors, and more particularly to improvements in the field oxidation step, well drive, field stop drive-in and latch-up, and radiation tolerance. It is equally applicable to wafer production or the manufacture of one or a few individual VLSI devices.

2. Prior Art

For years the prior art has been concerned with the "birdsbeak" effect and the effect of parasitic transistors, but to date only minimal progress has been made in eliminating either of these undesirable effects when growing the field oxide.

In the fabrication of devices with localized oxide (LOCOS) isolation, a layer of oxide ($SiO_2$) and a layer of nitride ($Si_3N_4$) are commonly used as a selective oxidation barrier during field oxide growth. The areas not protected by such layers are exposed and oxidized.

Ideal masking by the oxide and nitride against the field oxidation does not occur due to the diffusion of oxygen and the growth of $SiO_2$ (oxide) under the nitride layer. As a result, a ridge of $SiO_2$ protruding above the wafer is formed around the perimeter of the nitride mask. The profile of the oxide ridge in cross section appears as a birdsbeak. The beak is undesirable, since it creates an abrupt surface feature which can generate breaks or discontinuites in subsequent layers. Furthermore, the birdsbeak generates tapered side walls and this in turn generates a parasitic edge transistor.

The shape of the birdsbeak and the abruptness of the side wall angle depend on the following factors: (1) the thickness of the oxide between the silicon nitride and the silicon surface; (2) the quality of the silicon nitride film; (3) the thickness of the silicon nitride film; (4) the amount of silicon etched from the substrate (field region) prior to field oxidation; and (5) the temperature at which the field oxide is grown.

SUMMARY OF THE INVENTION

All of the problems mentioned above can be alleviated and, furthermore, the overall processing steps can be reduced by the use of a "diffused-field" process. By combining the field oxidation and well drive steps into a single operation performed at high temperature, one can produce devices that are insensitive to geometrical constraints and exhibit substantial radiation immunity. The execution of this invention invokes a novel architectural scheme next to be described.

A feature of this process is the well formation and concurrent processing; otherwise, it conforms with standard MOS silicon gate technology. A thin layer of oxide is grown over the blank wafer, then an LPCVD nitride is deposited followed by a CVD oxide layer. Next, the active layer is delineated and the CVD oxide, LPCVD nitride and thin thermal oxide are dry etched from field areas. The photoresist is removed. Then, the well mask is delineated, the CVD oxide removed and the well is implanted with the appropriate species (phosphorus for N well process). Then, the photoresist is removed and the field implant mask is patterned.

Next, the field implant is performed by implanting the appropriate species into the exposed field region using the CVD oxide and LPCVD nitride as a mask against the implant in the active areas (boron is used for N well process). This step enables the use of high energy implant to render optimum field inversion voltage control.

Next, the CVD oxide is removed followed by a photoresist strip operation. At this point, the wafers are ready for field oxide formation, well drive, and field drive, which are performed concurrently. Two distinct advantages are realized by the operation--first, the amount of birdsbeak encroachment is substantially reduced (e.g., 0.4 $\mu$m total for 7500 angstroms field oxide), and second, the well drive cycle time is reduced due to oxidation enhanced diffusion. Yet, another advantage is the added simplicity to the fabrication process due to the elimination of independent steps no longer necessary, since they are incorporated into one step (i.e., field oxide and well drive cycles). Notice here the advantages of controlling field doping independently so as to improve radiation tolerance.

Once the field oxide and the well drive cycles are completed, the LPCVD nitride and thin thermal oxide layers are removed from the active areas. At this point the corresponding device threshold implants can be performed, either through compensation or with the aid of an implant mask. Next, the gate oxide is grown and the gate electrode is deposited (polysilicon, silicide, etc.). Then, the gate is patterned and etched and the photoresist stripped. Next, the source and drains of the P- and N-channel devices are implanted with the aid of independent masking steps. The crossover oxide is deposited and reflowed (doped with phosphorus and boron) so as to attain smooth contours over the gate electrode in order to improve metal step coverage. Next, the contact mask is patterned and the contact windows are opened by the use of dry etching techniques.

Once the photoresist has been stripped off the wafers, the contact vias are cleaned and metal (1% silicon) is deposited over the entire wafer. The metal interconnects are delineated and etched, then the photoresist is stripped and the wafers are sintered. The scratch protection layer is deposited, patterned and etched, concluding the fabrication steps.

Among the advantages achieved through use of the subject processing are:
1. Isoplanar structures
2. Controlled redistribution of implanted species
3. Substantial reduction of birdsbeak effect
4. Optimum geometrical control during field oxidation (width)
5. Increased density because of reduction of birdsbeak phenomena
6. Decrease in well diffusion time
7. Simpler process architecture
8. Process equally compatible to N-, P- or Twin Tub Technology
9. Improved electrical parameter control by the reduction of parasitic transistor action (i.e., lateral effects on $V_T$ are considerably reduced)
10. Process suitable for VLSI applications
11. Reduce Latch-up sensitivity due to reduced field resistance.
12. Increased radiation immunity due to controlled doping of field and channel region
13. Maximum circuit operating speed by reducing doping under diffusion areas, thus reducing junction capacitance.

The significant reduction in "birdsbeak" effect enables the placing of structures (i.e., active areas) much closer to each other; hence, a marked improvement in layout density is achieved.

The reduction of field resistance due to deep field dopant diffusion further enhances latch-up immunity; thus, enhancing density, since active layers of different polarities (i.e., N+ and P+) can be placed much closer to each other. It has been demonstrated that with the use of this technique, spacings between N+ to P+ diffusions equivalent to those obtained from the Twin-Well process are achievable. However, the present invention, unlike a Twin-Well process, does not need an epitaxial film for fabrication, thus rendering more economical and suitable for fabrication.

Furthermore, by preventing field dopant diffusion under active areas, a much better performance is obtained because of reduced parasitic field capacitance.

BRIEF DESCRIPTION OF DRAWINGS

FIG. 9 shows a scanning electron microscope (SEM) photograph reproduction of the prior art. Here, notice the smooth transition 150 from active region 155 to field region 157. The slope of this transition region is calculated to be 0.45 at the immediate transition point a.

The purpose of diffusing dopants in the field region way below the oxide-silicon interface is to reduce field (substrate) resistivity so as to increase latchup immunity. Furthermore, by employing a fast oxidation cycle a minimum encroachment of dopants under the active region is realized (oxidation enhanced diffusion), thus, reducing the parasitic junction capacitance formed under sources and drains. This, in turn, increases circuit performance.

Care must be taken in implanting at the correct depth and dose so as to compensate for dopant segregation (diffusion into oxide) and decrease in peak concentration due to diffusion into silicon.

The dose is $3 \times 10^{13}$ boron atoms per cm$^2$, implanted by energy of 70 K$_v$.

Figure 13:
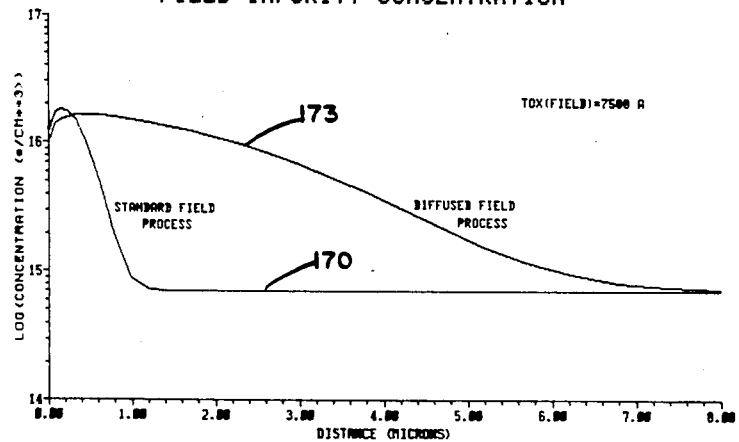

FIG. 13 shows the prior art curve 170 and the curve 173 of this invention. Notice here, that the concentration of dopants is identical at the interface, namely 1 to $2 \times 10^{16}$ per cubic centimeter boron. However, the prior art shows a depth of only 0.9 microns, while this invention shows a depth of 7.0 microns. Mathematical expressions to determine resistivity from these doping profiles are well covered in the literature and will not be discussed here. It is obvious that the resistivity has been substantially reduced (by a factor of 5 to 7 times). The choice of doses during ion implantation can be selected so as to improve radiation immunity while at the same time preserving device identity in the active regions by reducing dopant encroachment. The preferred process calls for an oxidation/drive cycle performed at 1165° C. (20' dry oxygen, 45' steam, and drive for 290' in a nitrogen ambient), the resulting field oxide thickness is 7000 angstroms.

The cycle for growing the field oxide is selected in a way as to improve the quality of the oxide, and at the same time minimize birdsbeak encroachment. The initial cycle (furnace insertion) is performed in a dry oxygen ambient to enhance oxide quality, next the ambient is switched to steam so as to speed up oxidation. This is followed by a nitrogen cycle for the purpose of driving the dopants deep into the silicon.

In order to improve radiation hardness immunity, the implant into the field regions of the N channel device is done at 70K boron and a dose of $3 \times 10^{13}$ ions per cm$^2$. After field oxidation, the doping concentration at the silicon - silicon dioxide interface (F.O.) is approximately $2 \times 10^{17}$ atoms per cubic cm.

DETAILED DESCRIPTION OF A PREFERRED EMBODIMENT OF THE INVENTION

Figure 1:
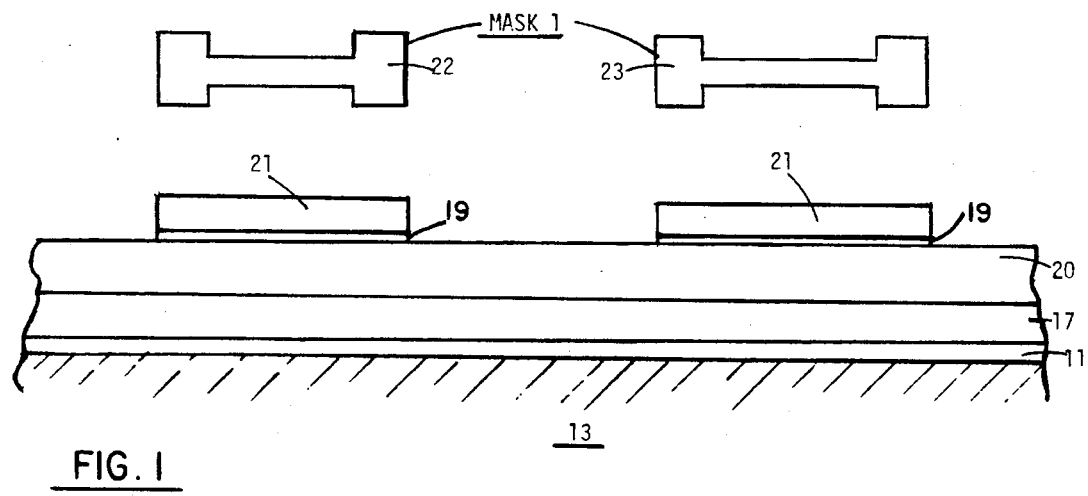
FIG. 1 shows a partial section of a wafer with thermal oxide, nitride, and delineated low temperature oxide and photoresists thereon.

Starting with a P-type substrate, the steps in the CMOS preferred process are as follows:

1. In FIG. 1, a very thin layer of silicon oxide 11 is grown on substrate 13. The preferable range for the oxide layer 11 is 0.50 to 200 angstroms because during field oxidation the thin layer 11 of oxide will prevent encroachment of the field oxide 15 (FIG. 4) under the silicon nitride layer 17. The thin layer growing of oxide layer 11 is accomplished in a dry oxygen ambient at a thousand degrees centigrade in the presence of HCl or a comparable element to reduce or prevent oxidation induced dislocations. Concentrations of ½% to 1½% of HCl in the ambient have been successfully employed.

2. Next, the relatively thick layer 17 of silicon nitride is laid down by, e.g., using a low pressure chemical vapor deposition process, to a thickness of 800 to 1500 angstroms which is thick enough to withstand and mask against subsequent oxidation steps in the present process.

3. Next, a low temperature oxide 20 (such as silox) is deposited over the nitride layer 17.

4. An anti-reflective coating (ARC) 19 (obtainable from Brewer Inc. P.O. Box CC, Rollo, Mo. 65401, (Tel. 314-364-0300)) is next laid down with a thickness of approximately 2000 angstroms to reduce reflectivity and thus obtain a one-to-one ratio from the mask to the printed image so as to maintain line width integrity. This coating also functions as a dehydrant which enhances photoresist adhesion. While the process is operative without this coating, much better control of dimensioning is obtained by using it and consequently it it is preferred.

5. Photoresist 21 is deposited over the low temperature oxide and delineated for both active regions using active opaque masks 22, 23 following conventional practices.

6. This step utilizes a light source (not shown) to expose the masks 22 and 23 and render the resist 21 soluble in the field region while the active regions are unexposed under the photoresist 21. The exposed portions of the resist 21 and ARC 19 are rendered soluble and removed, following conventional procedures.

Figure 11:
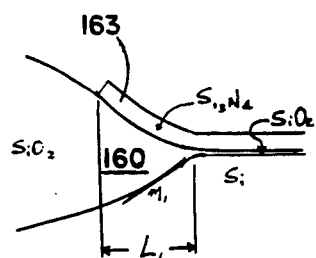
FIGS. 11 and 12 depict the results obtained from SEM photographs. The amount of encroachment of field oxide 160 under the masking nitride 163 is represented by dimensions L1 and L2, respectively. From the calibrated (dimensional) cross-section photographs (SEM) it is possible to estimate these dimensions. For the prior art, it is measured to be L1=0.455 microns while L2 for the disclosed approach in FIG. 12 is measured to 0.225 microns. Hence, the overall encroachment is reduced by about one-half in the present invention.
Figure 12:
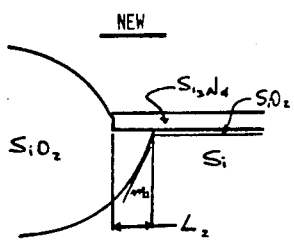
Figure 9:
Figure 10:
FIG. 10 shows results obtained with this invention. Here, the slope is calculated to be 3.8 at the transition region 150' from active region 155' to field region 157'.

7. With the photoresist "mask" 21 still in place, a dry etchant (reactive ion) is used to etch away the layers of oxide 11, nitride 17, and silox or oxide 20 in the field areas. The conventional reactive dry ion etch is anisotropic and etches vertical planes on the active region edges of the oxide 11, nitride 17 and L.T.O. 20 at right angles to the silicon wafer 13, as is clearly shown in FIGS. 2 and 3. The advantage here is that the strength of the nitride layer is better maintained to avoid direct encroachment of the field oxide therebeneath because the full thickness of the nitride is present at both ends. In other words, if one visualizes a slope on the ends, the nitride would get thinner and would be subject to buckling. Thus, the prior art pictures, FIGS. 9 and 11 are included to show the lifting or buckling of the conventional nitride layer with these figures showing the birdsbeak problem. Such problems are resolved by the present invention due to the novel combination of steps and to the rapid oxidation in steam environment.

The anti-reflective coating 19 was removed with the soluble resist in the field areas outside of the active areas. Consequently, the field area is removed to the bare silicon 13 and the active area alone stands above the substrate 13 including the thin oxide layer 11, silicon nitride layer 17, and silox or oxide 20, ARC 19, and photo resist coating 21.

7a. The photoresist 21 and ARC 19 are stripped.

8. Using well layer mask 2 in FIG. 2, the LTO oxide 20, is removed on the P-channel side by etching using a 5 to 1 BHF selective etch.

Figure 4:
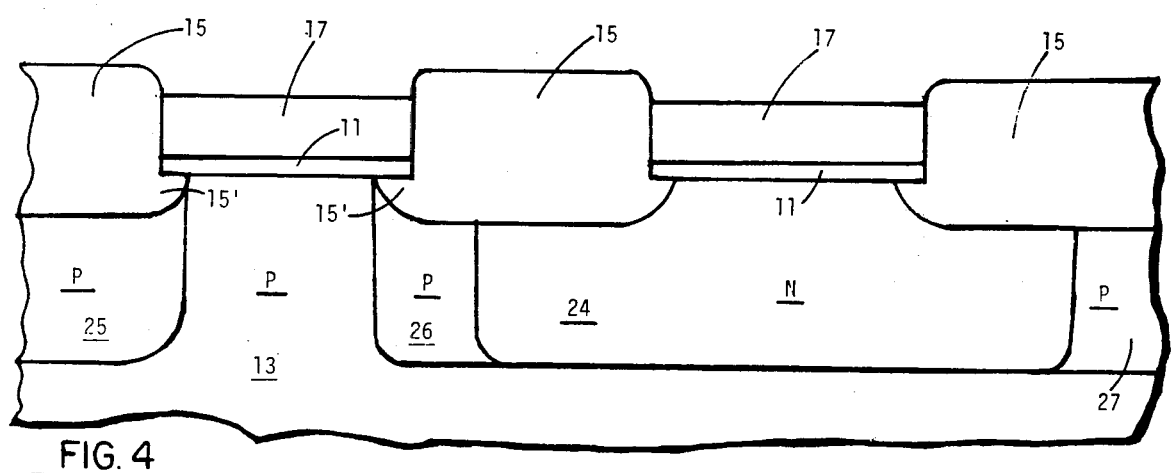
FIG. 4 shows the grown field oxide, diffused N well for the P-channel, and diffused P field for the N-channel.

9. The well 24 (FIG. 4) is implanted, as shown by arrows 25 (FIG. 2) with phosphorus (N) 26 (FIG. 4).

Figure 2:
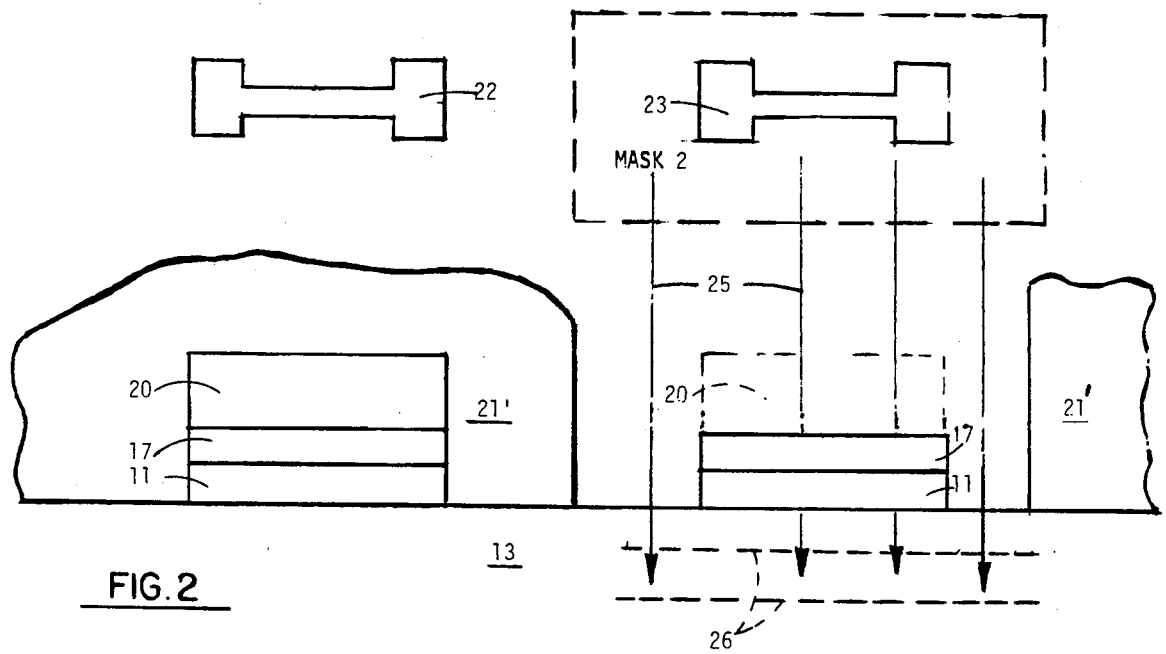
FIG. 2 shows the complete delineation of the active regions, removal of the low temperature oxide photoresist protecting the N-channel device, the opened P-channel device and well implant taking place in the P-channel device.
Figure 3:
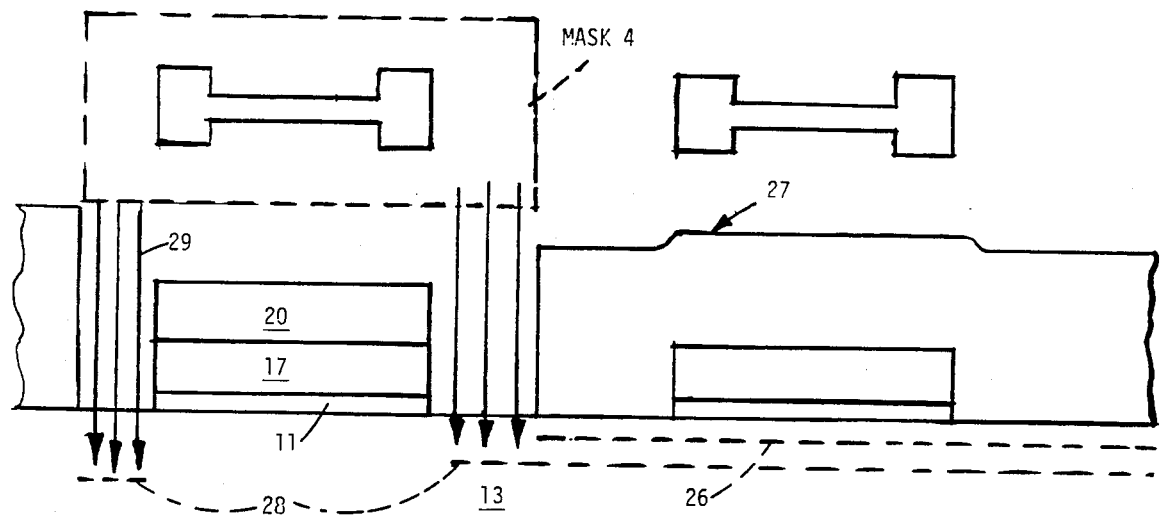
FIG. 3 shows the photoresist removed from the left hand N-channel device but protecting the right hand P-channel device, and the field implanting taking place for the N-channel field regions.

10. All resist 21' is stripped (FIG. 2). With the aid of MASK 4 and resist (FIG. 3) 27, the N-channel field is delineated.

10a. The next step is to implant the N-channel field with boron 28, along arrows 29, via MASK 4. The N-channel active device (FIG. 3) is protected by the LTO oxide 20 against the implant.

11. Etch LTO oxide.

12. Strip photo resist.

13. The next step is field oxidation. This critical step reduces the birdsbeak and grows the field oxide 15 (FIG. 4) at high temperature very rapidly, e.g., 1165° C. in a steam environment with a duration of 40 to 50 minutes to control the oxide thickness to 6,000 to 7,000 angstroms, using the pyrogenics water system. Further reference may be made to "VLSI FABRICATION PRINCIPLES", copyright 1983 by Ghandi, page 386, which shows the silicon oxidation curves and proves the plausibility of the herein specified characterization of the steam environment. Also, in Ghandi the pyrogenic's water system for wet vapor pressure oxidation is set forth in the last three paragraphs on page 385 and is thus in the knowledge of one skilled in the art as in FIG. 4. Furthermore, it diffuses the field dopant 28 to a depth equivalent to that of the well, hence reducing field resistance, which in turn enhances latch-up immunity.

Conventional processing of the field oxide is achieved at temperatures of about 1000° C. Also, the time to accomplish oxidation is much extended, and the well drive must be done at a different temperature, thereby necessitating further steps.

14. In FIG. 4, both channels are covered by oxide 11 and nitride 17, so the field oxide 15 is grown. In the present invention, the fast oxidation rate, together with the high temperature, further hardens the nitride 17, and the fast consumption of the silicon during the oxidation renders a nearly vertical slope beneath the active area as opposed to the shallow slope rendered by conventional processing. Thus, it may be seen that the present invention reduces the birdsbeak effect considerably, even though there is a slight lower protrusion 15' (shown exaggerated for clarity) while the upper oxide is prevented from any encroachment due to the hardened nitride 17.

From a study of actual photos taken of the subject devices, it is clear that the birdsbeak effect is reduced at least 50%.

Furthermore, the present invention allows for abrupt transition from active to field, thus reducing the "sidewalk" effect of a parasitic transistor associated therewith. This is very advantageous over the monotonic or smooth transition from active to field of the conventional processes.

15. The growing of field oxide 15 concurrently diffuses the N well 24 and the N-channel field 25, 26 and 27. See the discussion of FIGS. 9-13 for further information.

16. Remove nitride 17 in conventional fashion.

17. Grow sacrificial oxide (not shown) to 400 to 700 anstroms and remove. This is done to relieve stress created by the nitride during field oxidation at the edges of the active regions. Sacrificial layers have been employed for at least five years and consist of nothing more than silicon dioxide made from the silicon wafer in the present case. The reason for utilizing a sacrificial oxide (specified as 400-700 angstroms) is because nitride and silicon experience different thermal coefficients of expansion and, thus, a stress is established, particularly at high temperatures (as specified herein) where expansion and compression cause a differential due to the different rates. This establishes stress in the silicon unoxidized interface. Growing the sacrificial oxide to 400-700 angstroms thick actually consumes 200-300 anstroms of the silicon wafer which consumes the stressed surface portion of the silicon and removes the same to reduce it to silicon oxide. Of course, the thin oxide is in this silicon oxide but is not recognizable because it is all silicon oxide. The point is, the sacrificial oxide, oxidized the silicon wafer right through the thin oxide.

No claim of novelty, per se, for sacrificial oxides, anti-reflective coatings or wet steam environment oxidation is claimed. However, combinations of some of these steps, when taken at the disclosed parameters, produce the unique function of minimizing birdsbeak problems and thereby increasing yield.

17a. Conventional threshold adjust implants can take place at this time in order to adjust P or N-channel device threshold, either concurrently or independently with the aid of an additional masking step.

Figure 5:
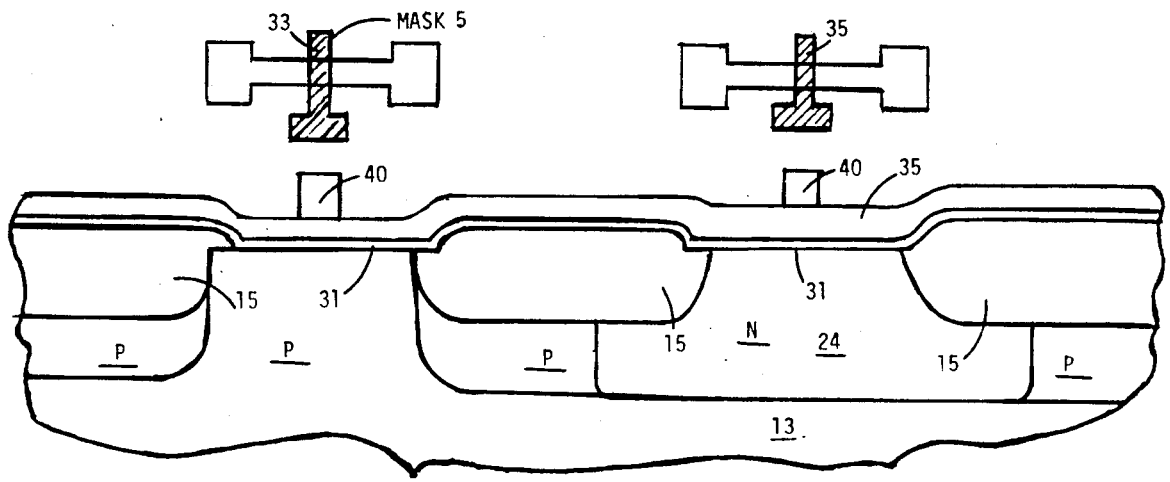
FIG. 5 shows the step of growing the gate oxide and depositing poly thereover, with masks in place delineating the gate electrode.

18. In FIG. 5, gate oxide 31 is grown across the active area to a thickness of 100 to 500 angstroms, depending on threshold voltages, gate oxide breakdown, and device operating voltage desired.

Figure 6:
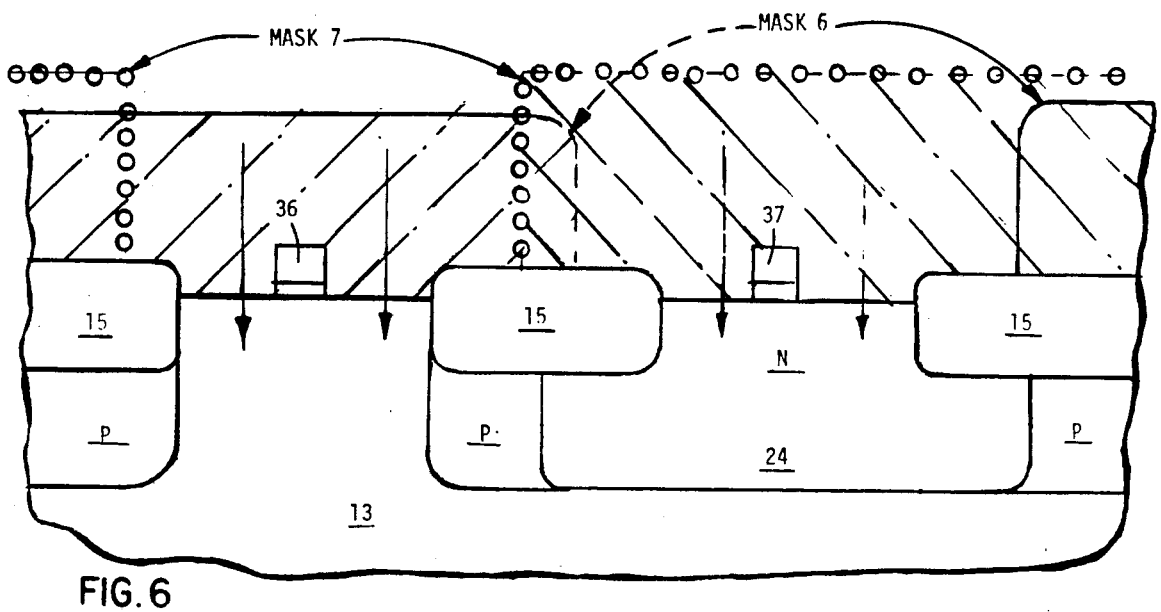
FIG. 6 shows the mask resist used in forming the source and drain for each device.

19. Next, polysilicon 35, shows as gate electrodes 36, 37 in FIG. 6 (after delineation) is deposited over the active area. Preferably, this is a doped poly to make the gate electrode conductive, if not, the polysilicon can be doped later by conventional methods (implantation or diffusion).

20. Apply anti-reflective coating (not shown).

21. Deposit resist 40.

22. The gate electrode mask 33, 35 (FIG. 5) is employed to delineate the gate electrodes 36 and 37, the remaining poly 35 is removed. For small geometries, the anti-reflective coating is preferred beneath the resist and the processing is handled in the way previously explained, but its use is optional.

23. Remove photoresist 40.

24. The gate poly 36, 37 acts as a mask for implanting the source and drain on either side thereof for the N-channel and P channel devices. Either arsenic or phosphorus is implanted for N-channel devices, and boron or boron difluoride for P-channel devices.

25. Using mask 6 (FIG. 6) over the well 24 device, source 39 and drain 40 are implanted. Boron or boron difluoride is the implant material. Next the resist is stripped.

26. Using MASK 7 over N-channel devices, source 41 and drain 38 are implanted. Arsenic is the implant material.

27. Strip resist.

Figure 7:
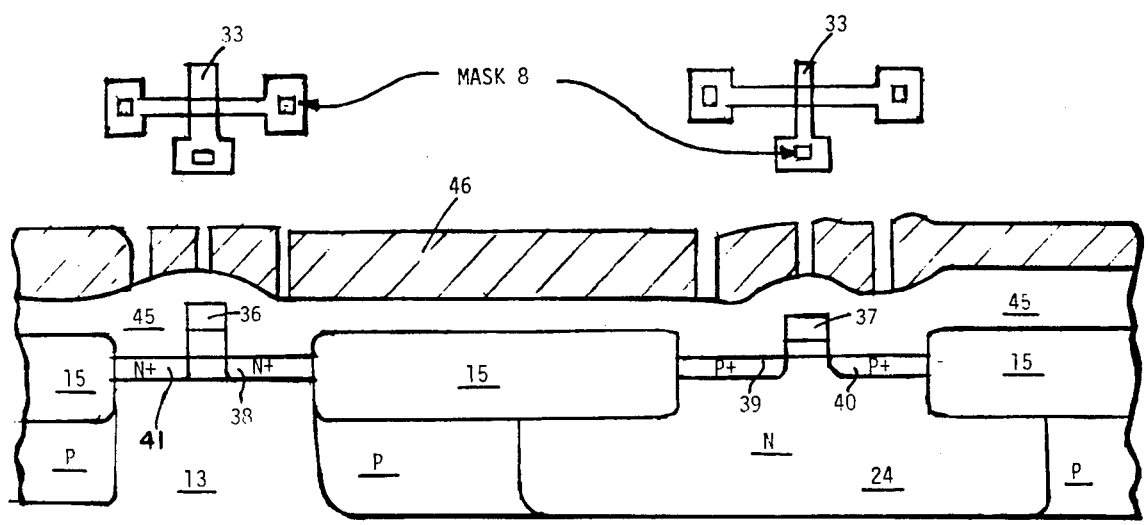
FIG. 7 shows the crossover oxide, the reflow thereof to smooth out the contours, and the contact masks; and, FIG. 8 shows the completed CMOS device.

28. Deposit conventional crossover oxide 45 (FIG. 7).

29. Reflow oxide 45 to smooth contour.

30. Use contact MASK 8 over resist 46.

31. Etch crossover oxide 45 (not illustrated).

32. Remove resist 46 (not shown).

33. Deposit aluminum/silicon metallization layer (not shown).

34. Mask metal layer, using mask 9.

35. Etch metal (see FIG. 8).

36. Strip resist (FIG. 8).

37. Sinter.

Figure 8:
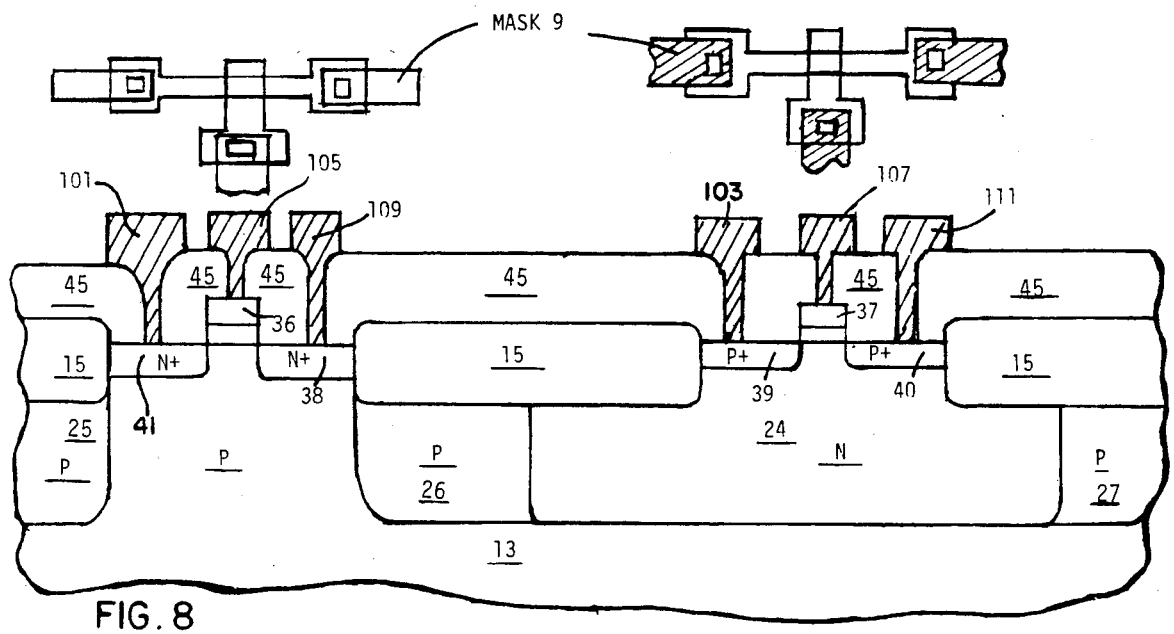

The completed CMOS device of FIG. 8 includes the source contacts 101, 103, gate poly contacts 105, 107 and drain contacts 109, 111. Crossover oxide 46 separates all electrodes and isolates the wafer on substrate 13.

What is claimed is:

1. A CMOS process for forming an N-channel device and a P-channel device on a P doped substrate while minimizing birdsbeak encroachment and the effects of parasitic transistors and establishing substantial radiation immunity, comprising the steps of:

delineating an active region surrounded by field for the N-channel device comprising a thin layer of oxide of 50–200 A thick, a layer of nitride of 800–1500 A thick and a further low temperature layer of low temperature oxide;

delineating an active region surrounded by field for the P-channel device comprising a thin layer of oxide and a layer of nitride in the above dimensions;

said delineating comprising using a dry reactive ion etch to etch away the thin layer of oxide and nitride in both channels and the low temperature layer of oxide for the N-channel substantially vertically of the substrate along the peripheries of each active region to maintain strength in the nitride layer by preserving its thickness to resist direct encroachment of field oxide therebeneath;

implanting a N-well beneath the P-channel active region and in the surrounding field region adjacent to the P-channel active region;

implanting the N-channel field with P type ions but not the active region thereof;

removing the further low temperature oxide layer from the N-channel active region;

rapidly growing field oxide for both channels at approximately 1165° C. in a steam environment for 40–50 minutes using the Pyrogenic water system to control the field oxidation thickness to approximately 6000 to 7000 A while concurrently driving-in the well implant and the field implant to render an abrupt transition from field oxide to active region to reduce sidewalk effect, further harden the nitride, and reduce birdsbeak effect;

removing the nitride layers;

growing sacrificial oxide and removing the same;

implanting threshold adjust;

growing gate oxide;

delineating a gate of doped polysilicon for each channel;

establishing an activated source and drain for each channel;

depositing crossover oxide; and, establishing metal contacts to each source and drain and to the gate polysilicon through the crossover oxide.

2. The process of claim 1, wherein:
   the sacrificial oxide is grown between approximately 400 to 700 angstroms to relieve stress created by the nitride during field oxidation at the edges of the active regions.

3. The process of claim 1, wherein:
   an anti-reflective coating is deposited on the further oxide prior to the step of delineating.

4. The process of claim 1, wherein:
   the field oxide is shaped by the process fast oxidation rate and high temperature for abrupt transition from the active region to the field region to establish a slope in the transition region of approximately 3.8.

5. The process of claim 4, wherein:
   the process shapes the field oxide with a protruding lip beneath the substrate surface relative to the field oxide above the substrate surface, but the protruding lip is confined to a length of approximately 0.225 microns.

6. The process of claim 1, wherein:
   the field dopant is diffused to approximately the same depth as the N-well within the substrate to reduce the field resistance and to enhance latch-up immunity.

* * * * *